(12) United States Patent
Lim

(10) Patent No.: US 9,818,902 B2
(45) Date of Patent: Nov. 14, 2017

(54) SOLAR CELL AND METHOD FOR MANUFACTURING THE SAME

(75) Inventor: Chin Woo Lim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 534 days.

(21) Appl. No.: 13/981,781

(22) PCT Filed: Oct. 6, 2011

(86) PCT No.: PCT/KR2011/007394
§ 371 (c)(1),
(2), (4) Date: Aug. 29, 2013

(87) PCT Pub. No.: WO2012/102449
PCT Pub. Date: Aug. 2, 2012

(65) Prior Publication Data
US 2013/0327383 A1    Dec. 12, 2013

(30) Foreign Application Priority Data

Jan. 25, 2011 (KR) ........................ 10-2011-0007516

(51) Int. Cl.
*H01L 31/0272* (2006.01)
*H01L 31/0725* (2012.01)
(Continued)

(52) U.S. Cl.
CPC .... *H01L 31/0725* (2013.01); *H01L 31/03923* (2013.01); *H01L 31/0749* (2013.01); *Y02E 10/541* (2013.01); *Y02P 70/521* (2015.11)

(58) Field of Classification Search
CPC ........ F24J 2/085; F24J 2/542; H01L 31/0543; H01L 31/0725
(Continued)

(56) References Cited

U.S. PATENT DOCUMENTS 5,720,827 A * 2/1998 Simmons ........ H01L 31/022466
136/249
7,071,496 B2 * 7/2006 Negami ......... H01L 31/022466
257/101
(Continued)

FOREIGN PATENT DOCUMENTS

CN     1574388 A     2/2005
CN   101814537 A     8/2010
(Continued)

OTHER PUBLICATIONS

Babar et al., Gallium doping in transparent conductive ZnO systems prepared by chemical spray pyrolysis, Journal of Physics D: Applied Physics, vol./Issue 41, pp. 1-6 (2008).*
(Continued)

*Primary Examiner* — Jayne Mershon
(74) *Attorney, Agent, or Firm* — Saliwanchik, Lloyd & Eisenschenk

(57) ABSTRACT

Disclosed are a solar cell and a method for manufacturing the same. The solar cell includes a substrate, a back electrode layer on the substrate, a light absorbing layer on the back electrode layer, a buffer layer on the light absorbing layer, and a window layer on the buffer layer. The buffer layer is formed through a chemical equation of $(A_xZn_{1-x})O$ ($0 \leq x \leq 1$), in which the A represents a metallic element.

9 Claims, 1 Drawing Sheet

(51) Int. Cl.
*H01L 31/0392* (2006.01)
*H01L 31/0749* (2012.01)

(58) Field of Classification Search
USPC .................................. 136/262, 265, 260
See application file for complete search history.

(56) References Cited

U.S. PATENT DOCUMENTS

| | | | |
|---|---|---|---|
| 2004/0089874 | A1 | 5/2004 | Negami et al. |
| 2005/0001233 | A1 | 1/2005 | Sugiyama et al. |
| 2009/0087940 | A1 | 4/2009 | Kushiya |
| 2010/0288361 | A1* | 11/2010 | Rudigier-Voigt ....... C03C 3/087 136/261 |
| 2011/0120521 | A1 | 5/2011 | Yamaguchi et al. |
| 2012/0118384 | A1 | 5/2012 | Hakuma et al. |

FOREIGN PATENT DOCUMENTS

| | | |
|---|---|---|
| CN | 101840942 A | 9/2010 |
| JP | 2000-332273 A | 11/2000 |
| JP | 2003-264306 A | 9/2003 |
| JP | 2004-158619 A | 6/2004 |
| JP | 2006-332440 A | 12/2006 |
| JP | 2009-267337 A | 11/2009 |
| JP | 2009-272544 A | 11/2009 |
| JP | 2010-074069 A | 4/2010 |
| JP | 2010-245189 A | 10/2010 |
| JP | 2010-272613 A | 12/2010 |
| JP | 2011-009287 A | 1/2011 |
| KR | 10 2008 0009346 * | 1/2008 |
| KR | 10-2008-0009346 A | 1/2008 |
| KR | 10-2010-0066975 A | 6/2010 |
| WO | WO-2010/058640 A1 | 5/2010 |

OTHER PUBLICATIONS

Kim et al., Effect of carrier concentration of optical bandgap shift in ZnO:Ga thin films, Thin Solid Films, vol./Issue 518, pp. 6304-6307 (2010).*
Contreras et al., Improved Energy Conversion Efficiency in Wide-Bandgap Cu(InGa)Se2 Solar Cells, NREL, IEEE Photovoltaic Specialists Conference, pp. 1-6 (2010).*
Office Action dated Feb. 9, 2015 in Chinese Application No. 201180056408.5.
Office Action dated Jun. 30 2015 in Japanese Application No. 2013-550370.
International Search Report in International Application No. PCT/KR2011/007394, filed Oct. 6, 2011.
Notice of Allowance dated Nov. 28, 2012 in Korean Application No. 10-2011-0007516, filed Jan. 25, 2011.
Office Action dated Mar. 9, 2016 in Chinese Application No. 201180056408.5.

* cited by examiner

[Fig. 1]
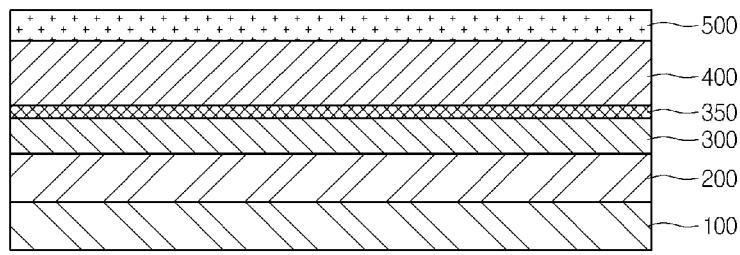
[Fig. 2]
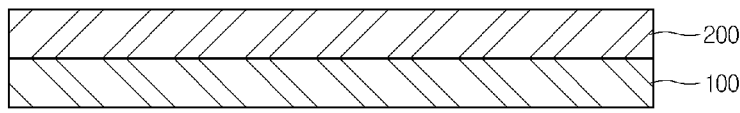
[Fig. 3]
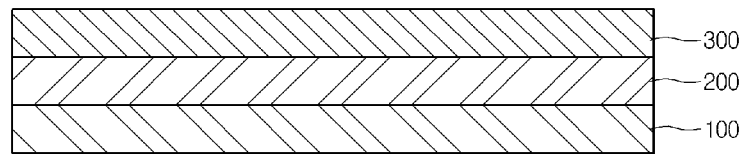
[Fig. 4]
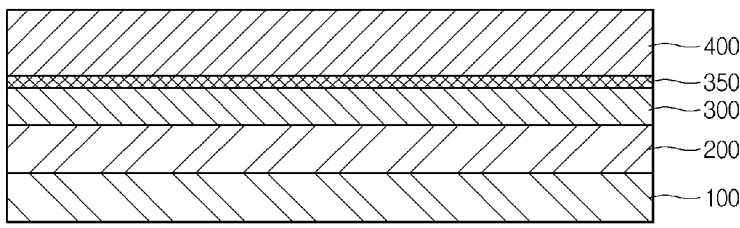
[Fig. 5]
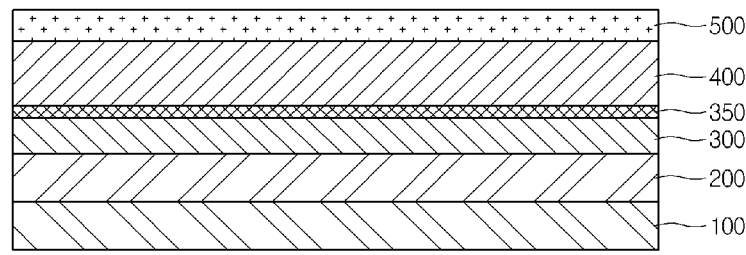

SOLAR CELL AND METHOD FOR MANUFACTURING THE SAME

CROSS-REFERENCE TO RELATED APPLICATIONS

This application is the U.S. national stage application of International Patent Application No. PCT/KR2011/007394, filed Oct. 6, 2011, which claims priority to Korean Application No. 10-2011-0007516, filed Jan. 25, 2011, the disclosures of each of which are incorporated herein by reference in their entirety.

TECHNICAL FIELD

The embodiment relates to a solar cell and a method for manufacturing the same.

BACKGROUND ART

Recently, as energy consumption is increased, the development on a solar cell to convert solar energy into electrical energy has been performed.

In particular, a CIGS-based solar cell has been extensively used, in which the CIGS-based solar cell is a PN hetero junction device having a substrate structure including a glass substrate, a metallic back electrode layer, a P type CIGS-based light absorbing layer, a high resistance buffer layer, and an N type electrode layer.

In addition, studies have been performed to improve electrical characteristics such as low resistance and high transmittance in a solar cell.

DISCLOSURE OF INVENTION

Technical Problem

The embodiment provides a solar cell representing high productivity with improved efficiency.

Solution to Problem

According to the embodiment, a solar cell includes a substrate, a back electrode layer on the substrate, a light absorbing layer on the back electrode layer, a buffer layer on the light absorbing layer, and a window layer on the buffer layer. The buffer layer is formed through a chemical equation of $(A_xZn_{1-x})O(0 \le x \le 1)$, in which the A represents a metallic element.

According to the embodiment, a method for manufacturing a solar cell includes forming a back electrode layer on a substrate, forming a light absorbing layer on the back electrode layer, forming a buffer layer having a chemical formula of $(A_xZn_{1-x})O(0 \le x \le 1)$ on the light absorbing layer, in which the A represents a metallic element, and forming a window layer on the buffer layer.

Advantageous Effects of Invention

As described above, the embodiment can provide a solar cell capable of solving the problems related to environmental pollution due to the buffer layer without cadmium.

The embodiment can provide a solar cell capable of improving productivity by consecutively performing the manufacturing process because the buffer and window layers are formed through the same PVD process.

The embodiment can provide a solar cell capable of increasing short circuit current density by increasing the transmittance due to the buffer layer including zinc, so that the photoelectric conversion efficiency can be improved.

BRIEF DESCRIPTION OF DRAWINGS

FIG. 1 is a sectional view showing a solar cell according to the embodiment; and FIGS. 2 to 5 are sectional views showing a method for manufacturing a solar cell panel according to the embodiment.

MODE FOR THE INVENTION

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings. The thickness and size of each layer shown in the drawings may be exaggerated, omitted or schematically drawn for the purpose of convenience or clarity. In addition, the size of elements does not utterly reflect an actual size.

FIG. 1 is a sectional view showing a solar cell according to the embodiment. Referring to FIG. 1, a solar cell panel includes a support substrate 100, a back electrode layer 200, a light absorbing layer 300, a buffer layer 400, and a window layer 500.

The support substrate 100 has a plate shape and supports the back electrode layer 200, the light absorbing layer 300, the buffer layer 400, and the window layer 500.

The support substrate 100 may include an insulator. The support substrate 100 may include glass, polymer, or metal. In more detail, the support substrate 100 may include a soda lime glass substrate.

If the support substrate 100 includes soda lime glass, sodium (Na) contained in the soda lime glass may be diffused into the light absorbing layer 300 including CIGS when manufacturing the solar cell. Accordingly, the concentration of charges of the light absorbing layer 300 may be increased.

Therefore, the photoelectric conversion efficiency of the solar cell may be increased.

In addition, the support substrate 100 may include a ceramic substrate including alumina, stainless steel, or polymer having flexibility. Therefore, the support substrate 100 may be transparent, rigid, or flexible.

The back electrode layer 200 is provided on the support substrate 100. The back electrode layer 200 is a conductive layer. The back electrode layer 200 moves charges generated from the light absorbing layer 300 of the solar cell so that current can flow to the outside of the solar cell. The back electrode layer 200 must represent high electrical conductivity or low resistivity to perform the functions.

In addition, since the back electrode layer 200 makes contact with a CIGS compound constituting the light absorbing layer 300, the back electrode layer 200 must make ohmic contact with the light absorbing layer 300, so that low contact resistance can be made.

The back electrode layer 200 must maintain stability under the high-temperature condition when the heat treatment process is performed under sulfur (S) or selenium (Se)

atmosphere as the CIGS compound is formed. In addition, the back electrode layer 200 must represent a superior adhesive property with respect to the support substrate 100 such that the back electrode layer 200 is not delaminated from the support substrate 100 due to the difference in the thermal expansion coefficient between the back electrode layer 200 and the support substrate 100.

The back electrode layer 200 may include one selected from the group consisting of molybdenum (Mo), gold (Au), aluminum (Al), chrome (Cr), tungsten (W), and copper (Cu). Among them, the Mo represents the low thermal expansion coefficient difference with respect to the support substrate 100 as compared with other elements. Accordingly, the Mo represents a superior adhesive property with respect to the support substrate 100 to prevent the back electrode layer 200 from being delaminated the support substrate 100. In addition, the Mo satisfies the characteristics required with respect to the back electrode layer 200.

The back electrode layer 200 may include at least two layers. In this case, the layers include the same metal, or different metals.

The light absorbing layer 300 may be formed on the back electrode layer 200. The light absorbing layer 300 includes a P type semiconductor compound. In more detail, the light absorbing layer 300 includes group I-III-V compounds. For example, the light absorbing layer 300 may have a Cu—In—Ga—Se-based crystal structure (Cu(In,Ga)Se2; CIGS), a Cu—In—Se-based crystal structure, or a Cu—Ga—Se based crystal structure.

The energy band gap of the light absorbing layer 300 may be in the range of about 1.1 eV to about 1.2 eV.

The buffer layer 400 is provided on the light absorbing layer 300. In a solar cell including a CIGS compound constituting the light absorbing layer 300, a PN junction is formed between a CIGS compound thin film including a P type semiconductor and the window layer 500 including an N type semiconductor. However, since two above materials represent great difference in a lattice constant and band gap energy, a buffer layer having the intermediate band gap between the band gaps of the two materials is required in order to form a superior junction.

The buffer layer 400 includes CdS or ZnS, and the CdS represents superior generating efficiency of the solar cell. However, a buffer layer including cadmium (Cd) causes environmental pollution. To this regard, according to the embodiment, the buffer layer 400 includes an organic metallic compound including zinc (Zn) instead of the CdS buffer layer.

According to the embodiment, the buffer layer 400 may include $(A_xZn_{1-x})O(0 \leq x \leq 1)$ materials, in which the A represents a group II element. According to the embodiment, although the buffer layer 400 includes MgZnO, the buffer layer 400 may include a compound containing Zn, and an element such as Ca or Sr may be used instead of Mg.

In the chemical formula of the buffer layer 400, the x has a value in the range of about 0.1 to about 0.5. The buffer layer 400 may have energy band gap in the range of about 3.3 eV to about 3.6 eV, and have a thickness in the range of about 10 nm to about 100 nm.

A zinc diffusion layer 350 may be formed at the contact region between the light absorbing layer 300 and the buffer layer 400. The zinc diffusion layer 350 is formed by the diffusion of Zn, which is contained in the buffer layer 400 when the buffer layer 400 is formed, into the light absorbing layer 300. For example, the zinc diffusion layer 350 may represent as a chemical formula of CIGS:Zn.

The zinc diffusion layer 350 may have a thickness of about 10 nm to about 100 nm. Since the zinc diffusion layer 350 includes an N type semiconductor. Since the buffer layer 400 including the N type semiconductor and the zinc diffusion layer 350 form homo-junction, the recombination of carriers can be reduced at the boundary surface between the light absorbing layer 300 and the buffer layer 400, so that the electrical characteristic of the solar cell can be improved.

The energy band gap of the zinc diffusion layer 350 may be in the range of about 2.4 eV to about 2.8 eV.

The window layer 500 is formed on the buffer layer 400. The window layer 500 is a transparent conductive layer. In addition, the resistance of the window layer 500 is higher than that of the back electrode layer 200.

The window layer 500 includes an oxide. For example, the window layer 500 may include zinc oxide, indium tin oxide (ITO), or indium zinc oxide (IZO).

For example, according to the embodiment, the window layer 500 may include Ga doped zinc oxide (ZnO:Ga). The mass ratio of Ga in the ZnO:Ga may be in the range of about 0.1% to about 3%. The mass ratio having the range is required to form the window layer 500 having energy band gap higher than that of the buffer layer 400, and the energy band gap of the window layer 500 may be in the range of about 3.6 eV to about 3.8 eV.

In addition, the oxide may include conductive impurities such as aluminum (Al), alumina ($Al_2O_3$), magnesium (Mg), or gallium (Ga). In more detail, the window layer 500 may include Al doped zinc oxide (AZO) or Ga doped zinc oxide (GZO).

According to the solar cell of the embodiment, the buffer layer 400 without Cd is formed, so that the problems related to the environmental pollution can be solved. In addition, since the buffer layer 400 includes Zn, transmittance can be increased, so that short circuit current density $J_{sc}$ can be increased.

In addition, since the buffer layer 400 and the window layer 500 are formed through the same PVD (Physical Vapor Deposition) process, the manufacturing process can be consecutively performed, so that productivity can be improved.

FIGS. 2 to 5 are sectional views showing the method for manufacturing the solar cell according to the embodiment. The description about the method for manufacturing the solar cell will be made based on the above description about the solar cell. The description about the solar cell may be basically linked with the description about the method for manufacturing the solar cell.

Referring to FIG. 2, after forming the back electrode layer 200 on the support substrate 100, the back electrode layer 200 may be deposited by using Mo. The back electrode layer 200 may be formed through the PVD scheme or a plating scheme.

In addition, an additional layer such as an anti-diffusion layer may be interposed between the support substrate 100 and the back electrode layer 200.

Referring to FIG. 3, the light absorbing layer 300 is formed on the back electrode layer 200.

For example, the light absorbing layer 300 may be formed through various schemes such as a scheme of forming a Cu(In,Ga)Se2 (CIGS) based-light absorbing layer 300 by simultaneously or separately evaporating Cu, In, Ga, and Se and a scheme of performing a selenization process after a metallic precursor film has been formed.

Regarding the details of the selenization process after the formation of the metallic precursor layer, the metallic precursor layer is formed on the back contact electrode 200 through a sputtering process employing a Cu target, an In target, or a Ga target.

Thereafter, the metallic precursor layer is subject to the selenization process so that the Cu(In,Ga)Se2 (CIGS) based-light absorbing layer 300 is formed.

Different from the above, the sputtering process employing the Cu target, the In target, and the Ga target and the selenization process may be simultaneously performed.

In addition, a CIS or a CIG light absorbing layer 300 may be formed through a sputtering process employing only Cu and In targets or only Cu and Ga targets and the selenization process.

Referring to FIG. 4, the buffer layer 400 is formed on the light absorbing layer 300. The buffer layer 400 may include Zn. Although the buffer layer 400 includes MgZnO, which is an organic metallic compound including Mg or O according to the present embodiment, the buffer layer 400 may include a group II element such as Ca or Sr other than Mg. The buffer layer 400 may be formed through the PVD scheme, and may have a thickness of about 10 nm to about 100 nm.

The zinc diffusion layer 350 may be formed by the diffusion of Zn, which is contained in the buffer layer 400, into the light absorbing layer 300. The zinc diffusion layer 350 may have an intermediate band gap between band gaps of the light absorbing layer 300 and the buffer layer 400. For example, the zinc diffusion layer 350 may have a band gap in the range of about 2.2 eV to about 2.8 eV.

Referring to FIG. 5, the window layer 500 is formed on the buffer layer 400. The window layer 500 is formed by depositing a transparent conductive material on the buffer layer 400.

As described above, the embodiment can provide a solar cell capable of solving problems related to environmental pollution by employing a buffer layer without cadmium.

The embodiment can provide a solar cell capable of improving productivity by consecutively performing the manufacturing process because the buffer and window layers are formed through the same vacuum process.

In addition, the embodiment can provide a solar cell capable of increasing short circuit current density by increasing the transmittance due to the buffer layer including Zn, so that the photoelectric conversion efficiency can be improved.

Any reference in this specification to 'one embodiment', 'an embodiment', 'example embodiment', etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell comprising:
   a substrate;
   a back electrode layer on the substrate;
   a copper(Cu)-indium(In)-gallium(Ga)-selenium(Se) crystal based light absorbing layer comprising a first portion and a second portion on the back electrode layer;
   a buffer layer on the light absorbing layer; and
   a window layer on the buffer layer,
   wherein the buffer layer has a chemical formula of $(Mg_xZn_{1-x})O$, in which the x has a value in a range of 0.1 to 0.5;
   wherein the first portion of the light absorbing layer has a chemical formula of $(Cu(In,Ga)Se_2)$ and is disposed on the back electrode layer,
   wherein the second portion of the light absorbing layer further comprises zinc (Zn), has a chemical formula of $(Cu(In,Ga)Se_2):Zn$, and is formed between the first portion of the light absorbing layer and the buffer layer;
   wherein the window layer has a chemical formula of (ZnO:Ga),
   wherein a mass ratio of Ga in the ZnO:Ga of the window layer is in a range of about 0.1% to about 3%,
   wherein a band gap energy of the first portion of the light absorbing layer is in a range of 1.1 eV to 1.2 eV,
   wherein a band gap energy of the second portion of the light absorbing layer is in a range of 2.4 eV to 2.8 eV,
   wherein a band gap energy of the buffer layer is in a range of 3.3 eV to about 3.6 eV, and
   wherein the first portion of the light absorbing layer has a thickness that is greater than that of the second portion of the light absorbing layer.

2. The solar cell of claim 1, wherein the buffer layer has a thickness in a range of 10 nm to 100 nm.

3. The solar cell of claim 1, wherein the second portion of the light absorbing layer has a thickness in a range of 10 nm to 100 nm.

4. The solar cell of claim 1, wherein the substrate includes at least one of glass and polymer metal.

5. A method for manufacturing a solar cell, the method comprising:
   forming a back electrode layer on a substrate;
   forming a light absorbing layer comprising a first portion having a chemical formula of $(Cu(In,Ga)Se_7)$ on the back electrode layer and a second portion having a chemical formula of $(Cu(In,Ga)Se_2):Zn$ between the first portion of the light absorbing layer and a buffer layer;
   forming the buffer layer having a chemical formula of $(Mg_xZn_{1-x})O(0.1 \le x \le 0.5)$ on the light absorbing layer; and
   forming a window layer on the buffer layer, the window layer having a chemical formula of (ZnO:Ga);
   wherein a mass ratio of Ga in the ZnO:Ga of the window layer is in a range of about 0.1% to about 3%,
   wherein a band gap energy of the first portion of the light absorbing layer is in a range of 1.1 eV to 1.2 eV,
   wherein a band gap energy of the second portion of the light absorbing layer is in a range of 2.4 eV to 2.8 eV,
   wherein a band gap energy of the buffer layer is in a range of 3.3 eV to about 3.6 eV, and
   wherein the first portion of the light absorbing layer has a thickness that is greater than that of the second portion of the light absorbing layer.

6. The method of claim 5, wherein the buffer layer is formed through a physical vapor deposition (PVD) process.

7. The method of claim 5, wherein the window layer is formed through a physical vapor deposition process.

8. The method of claim 6, wherein the buffer layer is formed through the same physical vapor deposition process consecutively to diffuse Zn into the light absorbing layer.

9. The method of claim 5, wherein the buffer layer and the window layer are formed through the same physical vapor deposition consecutively.

* * * * *